United States Patent [19]

Gordon et al.

[11] Patent Number: 4,573,255
[45] Date of Patent: Mar. 4, 1986

[54] PURGING: A RELIABILITY ASSURANCE TECHNIQUE FOR SEMICONDUCTOR LASERS UTILIZING A PURGING PROCESS

[75] Inventors: Eugene I. Gordon, Convent Station; Robert L. Hartman, Warren; Franklin R. Nash, Princeton, all of N.J.

[73] Assignee: AT&T Bell Laboratories, Murray Hill, N.J.

[21] Appl. No.: 592,285

[22] Filed: Mar. 22, 1984

[51] Int. Cl.$^4$ ............................................. H01L 21/66
[52] U.S. Cl. .................................... 29/574; 29/569 L; 29/585; 148/DIG. 72; 148/DIG. 95; 148/DIG. 162; 324/73 R; 324/158 D; 324/158 R; 324/158 T; 357/17; 372/46
[58] Field of Search ...................... 29/569 L, 574, 585; 148/DIG. 72, DIG. 95, DIG. 162; 324/73 R:158 R, 158 D, 158 T; 357/17; 372/46

[56] References Cited

U.S. PATENT DOCUMENTS

| | | | |
|---|---|---|---|
| 4,287,473 | 9/1981 | Sawyer | 324/158 R |
| 4,442,402 | 4/1984 | Besomi et al. | 324/158 D |
| 4,489,477 | 12/1984 | Chik et al. | 29/569 L |
| 4,507,606 | 3/1985 | Bédu et al. | 324/158 R |

OTHER PUBLICATIONS

"Reliability Assurance for Devices with a Sudden-Failure Characteristic", *IEEE Electron Device Letters*, vol. EDL-4, No. 12, Dec. 1983, pp. 467-468, R. H. Saul et al.

"Purging: A Reliability Assurance Technique for New Technology Semiconductor Devices", *IEEE Electron Device Letters*, vol. EDL-4, No. 12, Dec. 1983, pp. 465-466, E. I. Gordon et al.

"The Reliability of Semiconductor Devices in the Bell System", *Proceedings of the IEEE*, vol. 62, No. 2, pp. 185-211 (1974), D. S. Peck et al.

"Fabrication and Characterization of Narrow Stripe InGaAsP/InP Buried Heterostructure Lasers", *J. Appl. Phys.*, vol. 51, pp. 4539-4540 (1980), M. Hirao et al.

"Premature Failure in Pt-GaAs IMPATT's—Recombination-Assisted Diffusion as a Failure Mechanism", *IEEE Transactions on Electron Devices*, vol. Ed-25, No. 6, pp. 746-760 (1978), W. C. Ballamy et al.

"A Large Scale Reliability Study of Burnout Failure in GaAs Power FET's", 18*th Annual Proceedings Reliability Physics* 1980, Las Vegas, Nev., pp. 123-129, A. S. Jordan et al.

"Reliability and Failure Mechanisms of Electronic Materials", *Ann Rev. Mater. Sci.* 1978, 8:459-495 (1978), A. T. English et al.

"Accelerated Aging and a Uniform Mode of Degradation in (Al,Ga)As Double-Heterostructure Lasers", *J. Appl. Phys.*, vol. 48, No. 8, Aug. 1977, pp. 3225-3229, R. W. Dixon et al.

"Effect of Screening Tests on the Lifetime Statistics of Injection Lasers", *IEEE Journal of Quantum Electronics*, vol. QE-16, No. 11, Nov. 1980, pp. 1244-1247, Robert T. Lynch, Jr.

"Thermally Accelerated Degradation of 1.3 $\mu$m BH Lasers", *Electronics Letters*, vol. 19, No. 15, Jul. 1983, pp. 567-568, Y. Nakano et al.

"Screening of Long-Wavelength Laser at High Temperature and High Current Levels", *Electronics Letters*, vol. 19, No. 23, Nov. 1983, pp. 976-977, H. Higuchi et al.

*Primary Examiner*—William G. Saba
*Attorney, Agent, or Firm*—Michael J. Urbano

[57] ABSTRACT

Prior to packaging, semiconductor lasers are purged by being subjected first to high temperature and high current simultaneously so as to suppress stimulated emission and stress the shunt paths which allow leakage current to flow around the active region. A prudent, but nonessential, second step is to lower the temperature and/or current so that the lasers emit stimulated emission (preferably strongly, near the peak output power), thereby stressing the active region. Lasers subjected to such a purge exhibit stabilized degradation rates in short times (of the order of a few hours) and provide a robust population which meets the performance criteria of long lifetime systems.

17 Claims, 4 Drawing Figures

PURGING: A RELIABILITY ASSURANCE TECHNIQUE FOR SEMICONDUCTOR LASERS UTILIZING A PURGING PROCESS

BACKGROUND OF THE INVENTION

This invention relates to the manufacturing of semiconductor lasers and, more particularly, to a reliability assurance technique for such lasers.

The reliability of a lightwave system is a function of the reliability of the components which make up that system. The manufacturer of the system establishes quality standards for the components in such a way that overall system performance is assured within statistical confidence limits. The standards vary, however, depending on the system user's tolerance for system failure; i.e., the user's ability to absorb the costs of system down-time and component repair or replacement. In a terrestrial system, for example, it may be relatively easy to replace a failed component in a manhole, but in a submarine cable system it is extremely difficult and expensive to raise the cable from the ocean floor to the surface to effect repairs. As a consequence redundancy is built into such systems and lifetime requirements may exceed 25 years.

Long-lifetime requirements imply stringent quality assurance standards. Components are subjected to a regimen of electrical, optical and mechanical screening procedures in order to warrant the reliability of a given population of devices. For example, critical lightwave components such as laser diodes are visually inspected to uncover visible flaws (e.g., morphological defects), mechanically stressed to test chip and wire bonds, and thermally cycled to uncover cracks or flaws in the semiconductor material. In addition, light-current (L-I) and current-voltage (I-V) characteristics (and their derivatives) are measurd to determine threshold current, series resistance and the like. Finally, the lasers are subjected to accelerated aging, during which the lasers are operated for 1000s of hours at a typical optical output power (e.g., 3–5 mW/facet) at a higher-than-normal temperature (e.g., 60° C.). As the output power tends to decrease with time, a feedback control circuit increases the drive current in order to maintain the output power at a constant level. When the drive current exceeds a predetermined limit (e.g., a 50% increase), a laser is said to have failed. Performing accelerated aging on numerous lasers establishes a measure of reliability and may suggest design changes to enhance device lifetime.

Once the design is fixed, however, this type of testing does not insure reliability of a given population of lasers because while some laser failure modes are strongly temperature activated, others have little or no temperature dependence. For example, dark line defects (DLDs) are weakly temperature dependent. On the other hand, long term degradation in lasers is strongly temperature dependent.

Long-term degradation is the popular failure mode to address. Most prior art work focuses on it. Although it is strongly temperature activated, it may not be possible to operate the devices at high temperatures, D. S. Peck and C. H. Zierdt, *IEEE Proceedings*, Vol. 62, No. 2, pp. 185–211 (1974). As a result, degradation studies are usually lengthy and can be confusing because early degradation behavior may exhibit transient modes until the devices stabilize. Consequently, rates and acceleration factors (or the associated equivalent activation energies) are not always credibly determined. The observed degradation (increase in operating current at constant output power) of lasers of the etched mesa type operating at 1.3 μm may be used to illustrate the transient or saturable mode. These lasers are described by M. Hirao et al, *Journal of Applied Physics* Vol. 51, p. 4539 (1980).

Shown in FIG. 1 herein are a number of semiconductor laser degradation patterns for operating current which produces an optical power of 3 mW/facet CW in a 60° C. ambient. These lasers had previously shown less than a 5% increase in operating current after a burn-in of 100 hours in a 60° C. ambient at an optical power of 5 mW/facet. Some lasers show a constant rate of increase; others show highly variable rates. Despite appearances, all of the lasers are exhibiting a transient behavior mode and some have not yet stabilized. As a result, the long-term rate of aging is not known. Moreover, step-stress aging at different temperatures yields acceleration factors or equivalent activation energies that depend on the direction of the step. Consequently, predictions based on either isothermal or step stress aging may be inaccurate unless the aging rate behavior is stabilized.

Study of sudden failure modes by high temperature, bias aging is another typical reliability assurance technique as discussed by D. S. Peck et al supra. However, it frequently provides no information about failure modes that are, at best, weakly temperature activated. These modes represent a nightmare for the device designer. Too often these failures begin to show up late in the qualification cycle, sometimes long after early field deployment. See, for example, W. C. Ballamy et al *IEEE Transactions on Electron Devices*, Vol. ED-25, p. 746 (1978) or A. S. Jordan et al, 18th *Annual Proceedings Reliability Physics Symposium*, Las Vegas, p. 123 (1980).

SUMMARY OF THE INVENTION

Right from the beginning of our qualification cycle, semiconductor lasers are subjected to especially harsh stresses, called "purging," over time periods that are determined, but are relatively short. Ideally the stresses applied either eliminate lasers with randomly present, strongly or weakly temperature activated, degradation mechanisms, or saturate these mechanisms, leaving a robust population; i.e., a predictable, long-lived population controlled by a fundamental, intrinsic aging process present in all devices.

In accordance with one embodiment of our invention, stripe geometry semiconductor lasers are subjected to purging in order to stabilize their degradation patterns. By the phrase "stripe geometry laser" we mean a laser in which the active region has the shape of an elongated stripe and in which the structure constrains the terminal current to flow primarily in a relatively narrow channel through the active region. This major fraction of the terminal current will be referred to as pumping current. All such devices, however, have shunt paths which, in normal operation, allow a relatively small fraction of the terminal current to bypass the active region, thereby increasing the total terminal current which has to be applied in order for the pumping current to exceed the lasing threshold. This bypass current, in normal operation, will be referred to as leakage current. Examples of stripe geometry lasers within this definition include: real-index guided lasers (e.g., etched mesa buried heterostructure (EMBH) lasers of the type shown in FIG. 3 and channel substrate buried heterostructure lasers (CSBH) of the type shown in FIG. 2); and gain-guided lasers (e.g., proton-bombarded lasers), although in the latter case the lateral extent of the active region is less well defined.

The primary aspect our purging process entails first subjecting the laser for a relatively short time period simultaneously to an elevated temperature and a high current so that the laser emits essentially no stimulated emission, thereby stressing the shunt paths. Consequently, the laser will likely fail if it has defects in the shunt paths even though those defects may be only weakly temperature dependent and the laser would have survived a conventional long term aging test. In contrast, defects within the active region are not affected because nearly all of the terminal current is diverted around that region. To stress the active region, a preferred second step in our purging process entails lowering the temperature and/or current so that the laser emits stimulated emission preferably at or near its peak power for the temperature used, thus assuring that a major fraction of the terminal current passes through the active region.

Lasers purged according to the first step above have exhibited stabilized degradation rates in approximately 10 hours, thereby providing a robust population of devices suitable for long lifetime applications such as submarine cable systems.

Purging has other valuable attributes. It reveals failure modes quickly and is of immense help during the early part of the development/qualification cycle. Design and process iterations are readily made that protect against these failure modes, thereby decreasing the number of lasers which fail the purge and reducing the necessity for particular stresses. The stabilized and low degradation rates greatly reduce the testing intervals associated with certifying device reliability during manufacture. Purging allows a much more precise estimate of the yield of the certification procedures and aging rate of the purged population.

BRIEF DESCRIPTION OF THE DRAWING

Our invention, together with its various features and advantages, can be readily understood from the following, more detailed description taken in conjunction with the accompanying drawing, in which.

DETAILED DESCRIPTION

Figure 2:
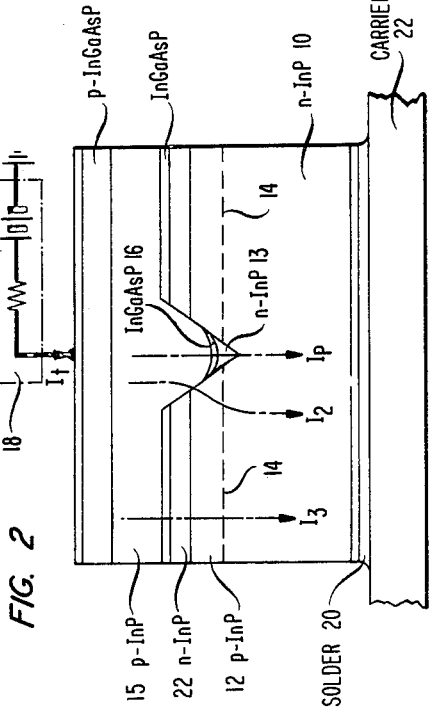
FIGS. 2 and 3 are schematic end views of CSBH and EMBH lasers, respectively, showing various current paths through the devices.
Figure 3:
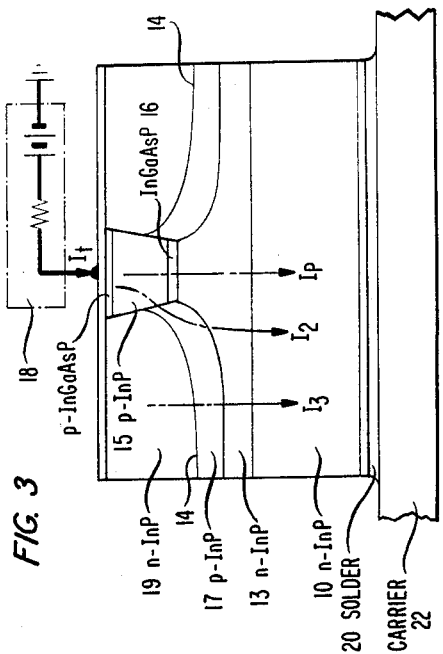

Before discussing in detail our invention, consider first the problem of leakage current in two illustrative real-index-guided semiconductor lasers: the CSBH and EMBH InP/InGaAsP lasers of FIG. 2 and FIG. 3, respectively. Both of these laser structures are well known in the art. The CSBH laser of FIG. 2 includes an n-InP substrate 10 mounted on a chip carrier 22 via a layer 20 of solder (e.g., Pb/Sn with a melting point of 183° C.). A blocking junction 14 is formed in or on the substrate by a p-InP layer 12. A V-groove or channel is etched through layer 12 into substrate 10 so as to bifurcate junction 14, and a well-known liquid phase epitaxy (LPE) technique is used to fabricate a double heterostructure in the channel. This structure includes an InGaAsP active region 16 which is positioned so as to contact layer 12 and is interposed between opposite-conductivity-type InP cladding layers 13 and 15. When the device is forward biased and terminal current is applied via source 18, the p-n junctions 14 are reverse biased so that a major fraction $I_p$ of the terminal current $I_t$ flows through the active region 16. When the current $I_p$, known as the pumping current, exceeds the lasing threshold, the active region emits light predominantly in the form of stimulated emission. However, the ability of the p-n junctions 14 to block current flow outside the active region is not perfect. Leakage current flows in at least two shunt paths: current $I_2$ through the diode formed by the substrate 10 and the portion of layer 12 above the active region 16, and current $I_3$ through the high gain transistor formed by substrate 10, layer 12 and n-InP layer 22.

Similarly the EMBH laser of FIG. 3 includes a double heterostructure formed by a pair of opposite conductivity type InP cladding layers 13 and 15 and an InGaAsP active region 16. This heterostructure is etched to form a mesa, and then LPE is used to regrow opposite conductivity type InP layers 17 and 19 to form blocking p-n junctions 14. The latter constrict terminal current $I_t$ from source 18 to flow predominantly through the active region 16; i.e., as pumping current $I_p$. But, as with the CSBH laser, the junctions 14 are imperfect and shunt paths exist. Leakage current $I_2$ flows through the diode formed by layers 15, 17, 13 and substrate 10, whereas leakage current $I_3$ flows through the transistor formed by layers 19, 17, 13 and substrate 10.

Under typical terrestrial operating conditions, these lasers are operated at room temperature or above with a suitable heat sink (not shown) coupled to chip carrier 22 or coupled directly to the chip. In other system applications, however, lower operating temperatures may be experienced (e.g., 10° C. in a submarine cable system). The lasers may be driven with terminal currents in the range of, for example, 10–100 mA with output powers of, illustratively, a few mW/facet. The output wavelength ranges from 1.1 to 1.6 μm depending upon the composition of the active region 16.

At high temperatures (e.g., >100° C.), however, these lasers (and semiconductor lasers in general) emit virtually no stimulated emission regardless of the pumping current level. Likewise at high currents (e.g., of the order of 1 A) the lasers also emit virtually no stimulated emission, regardless of the temperature of operation. A small, but insignificant amount of spontaneous emission may occur in both of these cases, however. The inability of the laser to emit stimulated emission under these circumstances is the existence of thermally dependent shunt current paths of the type described above. The leakage current in these paths is either directly increased by the high ambient temperature or indirectly increased by the heating effect of the high current level.

This thermal aspect of device physics is exploited in the purging technique in accordance with our invention. In the primary aspect of purging, high temperature and high current are simultaneously applied to the laser so that it emits virtually no stimulated emission. Thus, only shunt paths are being stressed. Consequently, defects within the active region are not affected because the terminal current has been diverted almost totally to the shunt paths. In a preferred second step the temperature and/or current are lowered sufficiently so that the laser undergoes stimulated emission, preferably at a high optical power output level, thus insuring that a major fraction of the terminal current passes through the active region. The second step stresses defects in the active region. It is important to note, however, that the first step is relatively short in duration, illustratively, of the order of 10 h. On the other hand, the duration of the second step is not critical and is typically about 100 h.

We have found that the first step is critical in eliminating from a population of lasers those which would have been infant failures and in stabilizing the remainder. The result is a robust population of lasers having a high likelihood of satisfying long lifetime system criteria.

Typically, our purging technique is preceded by several screening procedures. The laser chips at this stage are mounted on a stud but are not as yet hermetically packaged. These screening procedures illustratively include: (1) measurement of the L-I and I-V characteristics (and derivatives thereof) under CW and pulsed conditions at a variety of temperatures (e.g., 10° C., 30° C., 60° C., and 70° C.), in order to determine numerous device parameters such as series resistance, reverse current, modulation current, spontaneous emission, location of kinks (nonlinearities in the L-I characteristic), wavelength, spectral width, microwave pulsations, far field beam pattern, thermal resistance, etc., and (2) microscopic inspection to determine that the laser chip is free of large cracks, that all wire bonds are intact, that gold plating meets specifications, that the active region is free of residue or blockage, etc.

Following these screening procedures, the two step purging process takes place. Illustratively, in the first step the laser is forward biased, driven at 250 mA, and heated to 150° C. in a nitrogen ambient for a period of about 10–12 h. In the second step the laser is forward biased, driven at 200 mA, and heated to 60° C. in a nitrogen ambient for 100 h so that it operates near its peak optical output power (e.g., 6–8 mW/facet). In both steps the use of a nitrogen atmosphere is prudent but not essential.

Our invention, however, is not limited to the precise set of temperature/current conditions specified above. During the first step of the purge, the maximum ambient temperature $T_o$ is limited by the melting point of the solder 20 (FIGS. 2 and 3) used to mount the laser chip onto the carrier. Illustratively, solder 20 is a Pb/Sn solder having a melting point of 183° C. In addition, the active region temperature $T_a$ will be $\Delta T$ degrees above the ambient where $$\Delta T = RVI,$$

R is the thermal resistance of the semiconductor material (e.g., 50° C./W for InP/InGaAsP), V is the applied voltage (e.g., 1.5–2.0 V), and I is the terminal current (e.g., 200–250 mA). If $T_o = 150°$ C., $I = 250$ mA and $V = 2.0$ V, as in the first step of the purge, then $\Delta T = 25°$ C. and the active region will be at about 175° C. The solder layer 20 will be somewhat cooler and hence safely below its melting point. However, if $T_o = 100°$ C., and an applied current as high as 750 mA was used, then $\Delta T = 75°$ C. and $T_a$ would still be 175° C. In both cases the laser would emit virtually no stimulated emission.

During the second step of the purge, on the other hand, the applied current may take on a wide range of values (e.g., 150–300 mA), as may the ambient temperature which may be anywhere below the maximum temperature at which lasing occurs (e.g., 100° C.). High currents insure that the laser operates near its peak power output for the particular ambient temperature used. This condition insures that the active region is stressed. But the temperature should not be so high (e.g., >100° C.) that stimulated emission is suppressed.

Following the purge procedures, the laser chips (still unpackaged) are subjected to a purging verification test (i.e., operation at a constant optical output power at an elevated temperature for a time on the order of 100 h) in order to determine whether their degradation rates had indeed stabilized. Illustratively, the lasers are subjected to 60° C. at 3 mW/facet for $\geq 200$ h. If the degradation rates are found to be too high, the lasers may be purged again using the purge procedure described above.

Once the degradation rates are stabilized, the laser chips are hermetically packaged and then subjected to environmental tests including, for example, rapid thermal cycling between 0° C. and 60° C., mechanical shock testing, and humidity testing at 65° C. and 85% relative humidity.

Then the packaged lasers are subjected to accelerated aging tests at 60° C., 5 mW/facet for $\geq 1000$ h to determine whether the degradation rate of the optical output power is <5%/1000 h. Finally, a system temperature aging test is performed; i.e., long term operation at (or near) the intended operating temperature of the system. For example, for a submarine cable system, the lasers are operated at 10° C., 5 mW/facet for $\geq 4000$ h to determine the degradation rate again. Here, the requirements may be stringent depending on system specifications (e.g., <0.25%/1000 h change in light output power).

VERIFICATION EXAMPLE

To demonstrate the effectiveness of our purging technique verification tests have been performed. These tests involved thermally accelerated aging of two sets of EMBH lasers originating from one sample population: an unpurged set selected at random and a set which successfully passed the purging tests (purge survivors). One measure of the effectiveness of the purge was obtained by comparing the distribution of the degradation rates of the survivors with that of the unpurged population. After only 10 h of purging, the purge survivors all had degradation rates equal to the lowest rates measured for the unpurged set after 1000s of hours, thereby demonstrating that the purge selection procedure worked and that it did not damage the lasers which survived the purge.

All of the lasers in the starting population had already passed a conventional two-step screening procedure known as an elevated temperature burn-in:

(i) operation in a 60° C. ambient at a constant optical power output of 5 mW/facet for 24 h with an acceptance criterion of $\Delta I_o/I_o \leq 1.5\%$; and similarly, (ii) 60° C., 5 mW/facet, 100 h, $\Delta I_o/I_o \leq 5\%$, where $\Delta I_o$ and $I_o$ are the increase in operating (terminal) current and its initial value to produce a given output power, respectively. Burn-in tests (operation at normal outputs at elevated temperatures for a short duration, about 100 h) are useful for eliminating some so-called infant failures. Potential low thermal activation energy modes of failure may not, however, be identified in this kind of screening test. We found that due to the existence of an initially occurring saturable mode of degradation, which existed to some degree in virtually all lasers, and which typically can escape detection by conventional burn-in tests because it has an incubation period, the conventional elevated temperature burn-in was found to be inadequate to assure reliability of its survivors. However, our purging procedure, which was imposed on the burn-in survivors, was essential to providing adequate reliability assurance.

The burn-in survivors were subjected to initial screening tests which did not generally produce degradation. Microscopic inspection was used to check for missing, broken, or unattached wires; for cracked, misaligned, facet-contaminated or misbonded chips; and for handling damage. Next, the L-I and I-V characteristics (and derivatives thereof) of the lasers at 30° C., 50° C., and 70° C. were measured under both pulsed and dc electrical excitation. These characterizations included plots of L-I, dL/dI, IdV/dI, and $I^2 d^2V/dI^2$. These curves were used to measure a variety of electrical and optical parameters mentioned previously.

Figure 1:
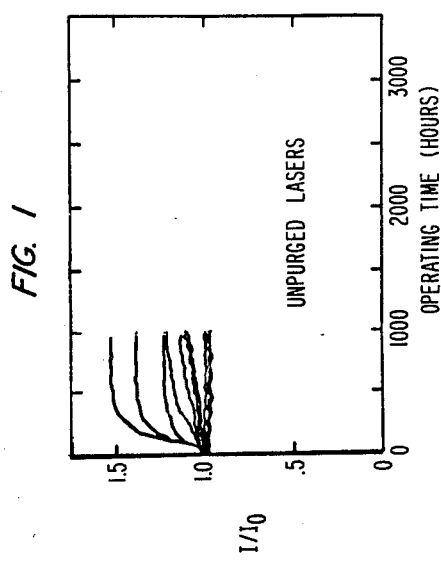
FIG. 1 shows the degradation behavior at 60° C. of EMBH lasers which had been previously screened using the following burn-in conditions; 60° C., 5 mW/facet, 100 h, $\Delta I/I \leq 5\%$.

In accordance with the purging aspects of our invention, the lasers, burned-in and screened as above, were subjected to a relatively harsh stress by subjecting them simultaneously to sufficiently high temperature and high current such the active region emitted essentially no stimulated emission. The terminal current under such conditions flowed primarily through the shunt paths rather than the active region. More specifically, these lasers were subjected to a terminal current 250 mA and a 150° C. ambient. This step was effective to stabilize the degradation rates in a time of the order of 10 h. The data of FIG. 1 showed that virtually all lasers exhibited an initial transient mode of degradation. These transient modes were compelled to stabilize rapidly (within a few hours) in the high temperature-high current stress regime of the purge. After stabilization, the degradation rates of all surviving lasers were substantially lower and very similar to one another (FIG. 4), despite the larger degradation rate differences in the prestabilization time period (FIG. 1, t<1000 h).

The second step in the purge regimen was to stress the active region of the laser by causing it to emit stimulated emission strongly; i.e., at an optical power output level near its peak power (e.g., 6–8 mW/facet) at the ambient temperature. More specifically, the lasers were subjected to 200 mA of current in a 60° C. ambient for a period of about 100 h.

Next we considered the effect of a longer term elevated temperature burn-in on devices which had survived the foregoing two-step purging process. The general intent of the burn-in testing was to detect the early failure fraction of the wear-out population. Forty lasers were divided into equal groups. Each group had an equal number of representatives from each of eleven semiconductor wafers. One group, but not the other, was exposed to the purging sequence described above. Both groups were then subjected to an elevated temperature burn-in at 60° C., 3 mW/facet for 1000 h.

The previously purged population exhibited low rates of degradation in contrast to the previously unpurged group which exhibited a variety of much larger rates of degradation. Despite the variety, all of the degradation patterns were caused by an initially-occurring saturable mode of degradation which could be compelled to stabilize in about 10 h during the first step of the purge process.

FIG. 1 is illustrative of the widely varying degradation rates of unpurged lasers. In contrast, FIG. 4 exhibits the normalized operating currents for fourteen lasers for approximately 7000 h of a 60° C. burn-in at 3 mW/facet. Similar results were obtained for thousands of lasers. The purge process which preceded this extended-duration burn-in at 60° C. did not consume an intolerable fraction of useful operating lifetimes, nor was the purge process inherently destructive of good lasers. As a consequence, long-term degradation rates of purged lasers have been found to be so low that, with some confidence, a lightwave system, such as a submarine cable system, may be contemplated with an extremely conservative definition of device failure.

Figure 4:
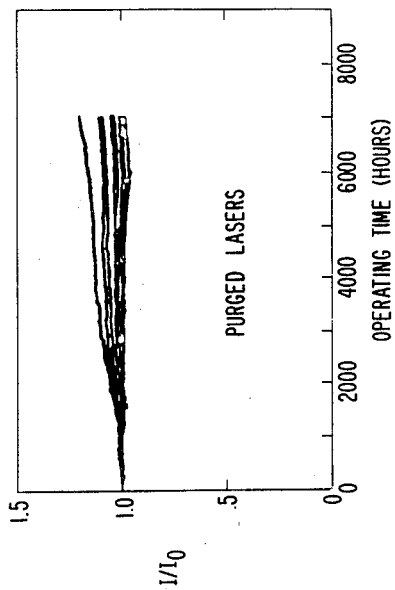
FIG. 4 shows the degradation behavior of EMBH lasers after a burn-in at 60° C. and 3 mW/facet. These lasers had been previously screened (see the FIG. 1 description above) and then were purged; i.e., subjected to high temperature (150° C.) and high current (250 mA dc, no stimulated emission output) for 10 h followed by lower temperature (60° C.) and lower current (200 mA, high optical power output) for 350 h.

Note FIG. 4 demonstrates the efficacy of our purge process in that degradation rates are shown to be stabilized for 7000 h at 60° C. At 10° C. a time period of 7000 h is equivalent to more than 125 years of system life. In practice, however, the post-purge burn-in need not be so long to assure the reliability of the purge survivors (e.g., 1000 h at 60° C. is adequate and does not consume so much of the device lifetime).

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. Although the experiments described above were performed on InP/InGaAsP lasers, our purging technique is applicable to semiconductor lasers fabricated from other materials systems as well (e.g., GaAs-/AlGaAs).

What is claimed is:

1. A method of manufacturing semiconductor lasers, which includes screening lasers relative to predetermined performance criteria, comprising the steps of:
   (a) subjecting each of said lasers to a first temperature $T_1$,
   (b) applying terminal current $I_1$ to each of said lasers such that the combination of said current $I_1$ and temperature $T_1$ is sufficiently high that said lasers emit virtually no stimulated emission,
   (c) continuing steps (a) and (b) concurrently for a time period $t_1$,
   (d) measuring an electrical and/or optical characteristic of said lasers so as to separate those which meet predetermined performance criteria from those which do not.

2. The method of claim 1 including, after step (c), the additional step (c1) of changing the level of said temperature and/or current such that each of said lasers emits stimulated emission for a time period $t_2$ at an optical power level near the peak power for said changed temperature.

3. The method of claim 1 wherein
   each of said lasers has an elongated, stripe-shaped active region and shunt paths which allow leakage current to flow around said active region, and
   steps (a), (b) and (c) are effective to cause said terminal current to flow primarily in said shunt paths of each laser.

4. The method of claim 2 wherein each of said lasers has an elongated, stripe-shaped active region and shunt paths which allow leakage current to flow around said active region, steps (a), (b) and (c) are effective to cause said terminal current to flow primarily in said shunt paths of each laser, and step (c1) is effective to cause said terminal current to flow primarily through said active region of each laser.

5. The method of claims 3 or 4 wherein step (a) subjects each of said lasers to a temperature $T_1 \geqq 100°$ C., step (b) applies current $I_1 \geqq 250$ mA dc, and step (c) applies said current and temperature for a relatively short time duration on the order of 10 h.

6. The method of claim 4 wherein step (c1) lowers said temperature to less than 100° C. for said time peiod $t_2$ which is longer than said time period $t_1$.

7. The method of claim 6 wherein step (c1) lowers said current to $\leqq 250$ mA.

8. The method of claim 7 wherein step (a) subjects each of said lasers to a temperature $T_1 \geqq 100°$ C., step (b) applies current $I_1 \geqq 250$ mA dc, and step (c) applies said current and temperature for a relatively short time duration on the order of 10 h.

9. The method of claim 1 wherein, between steps (c) and (d), said lasers are subjected to a verification test comprising: step (c2)-heating said lasers to a temperature less than 100° C. while maintaining the output power of said lasers constant, and step (c3)-measuring the degradation rates of said lasers.

10. The method of claim 9 including, after step (c3), the additional step (c4) of repeating steps (a), (b) and (c) for those lasers whose degradation rates do not satisfy performance criteria.

11. The method of claims 2, 9 or 10 further including, after steps (c), (c1), (c2), (c3) or (c4), the additional step (c5)-hermetically packaging each of said lasers.

12. The method of claim 11 further including, after packaging step (c5), step (c6)-accelerated aging said lasers at an elevated temperature less than about 100° C., but above the intended operating temperature, and at a constant optical power for a time period of the order of 1000 h, and step (c7)-operating said lasers at or near said operating temperature at a constant optical power for a time period of the order of a few thousand hours, and, after each of steps (c6) and (c7), separating those lasers which meet performance criteria from those which do not.

13. The method of claim 11 wherein, after packaging step (c5), said lasers are subjected to one or more of the following steps:

(c8) thermally cycling said lasers between a relatively low temperature and a relatively high temperature, (c9) mechanical shocking said lasers, (c10) subjecting said lasers to an environment having an elevated temperature and a high relative humidity, and (c11) measuring the current-voltage and light-current characteristics, and derivatives thereof, of said lasers at a plurality of temperatures less than about 100° C. to determine whether the electrical and optical properties of said lasers meet performance criteria.

14. The method of claim 13 wherein during step (c8) said lasers are thermally cycled between the operating temperature and approximately 60° C. a plurality of times.

15. The method of claim 13 wherein during step (c10) said lasers are subjected to an environment heated to about 65° C. and having a relative humidity of about 85%.

16. The method of claim 13 wherein during step (c11) said characteristics and said derivatives are measured at temperatures less than about 60° C.

17. The method of claim 1 wherein, before step (a), said lasers are subjected to one or more of the following steps:

(a1) measuring the current-voltage and light-current characteristics, and derivatives thereof, of said lasers at a plurality of elevated temperatures less than about 100° C. to determine whether the electrical and optical properties of said lasers satisfy performance criteria, and (a2) visually inspecting said lasers for defects.

* * * * *

UNITED STATES PATENT AND TRADEMARK OFFICE
CERTIFICATE OF CORRECTION

PATENT NO. : 4,573,255

DATED : March 4, 1986

INVENTOR(S) : Eugene I. Gordon-Robert L. Hartman-Franklin R. Nash

It is certified that error appears in the above-identified patent and that said Letters Patent is hereby corrected as shown below:

Column 6, line 19, "200 h" should read --100 h--.

Column 9, line 11, "$\geq 100°C$" should read -->100°C--.

Column 9, line 12, "$\geq 250$ mA" should read -->250 mA--.

Column 9, line 16, "peiod" should read --period--.

Column 9, line 19, "$\leq 250$ mA" should read --<250 mA--.

Column 9, line 21, "$\geq 100°C$" should read -->100°C--.

Column 9, line 22, "$\geq 250$ mA" should read -->250 mA--.

Signed and Sealed this

Fifth Day of September, 1989

*Attest:*

DONALD J. QUIGG

*Attesting Officer*  Commissioner of Patents and Trademarks